(12) United States Patent
Tanaka et al.

(10) Patent No.: US 7,971,349 B2
(45) Date of Patent: Jul. 5, 2011

(54) BUMP BONDING METHOD

(75) Inventors: Masaaki Tanaka, Kariya (JP);
Kimiharu Kayukawa, Nisshin (JP)

(73) Assignee: DENSO CORPORATION, Kariya (JP)

( * ) Notice: Subject to any disclaimer, the term of this patent is extended or adjusted under 35 U.S.C. 154(b) by 84 days.

(21) Appl. No.: 12/382,876

(22) Filed: Mar. 26, 2009

(65) Prior Publication Data

US 2009/0241337 A1 Oct. 1, 2009

(30) Foreign Application Priority Data

Mar. 26, 2008 (JP) ................. 2008-079771

(51) Int. Cl.
*H05K 3/30* (2006.01)

(52) U.S. Cl. ......... 29/832; 29/840; 29/841; 228/180.22; 228/180.5; 438/615; 438/617

(58) Field of Classification Search ............ 29/832, 29/840, 841; 228/180.22, 180.5; 438/615, 438/617

See application file for complete search history.

(56) References Cited

U.S. PATENT DOCUMENTS

| | | | |
|---|---|---|---|
| 5,633,204 A * | 5/1997 | Tago et al. ........ | 438/614 |
| 6,538,335 B2 | 3/2003 | Shimada et al. | |

FOREIGN PATENT DOCUMENTS

| | | | |
|---|---|---|---|
| JP | A-04-116944 | | 4/1992 |
| JP | 6-188289 | * | 7/1994 |
| JP | A-2000-232129 | | 8/2000 |
| JP | A-2003-197672 | | 7/2003 |
| JP | A-2008-035918 | | 2/2008 |

OTHER PUBLICATIONS

Office Action mailed May 11, 2010 issued from the Japan Patent Office in the corresponding patent application No. 2008-079771 (and English translation).

* cited by examiner

*Primary Examiner* — C. J Arbes
(74) *Attorney, Agent, or Firm* — Posz Law Group, PLC

(57) ABSTRACT

In a method of bonding a first bump on a surface of a first member and a second bump on a surface of a second member, a tip portion of the first bump is provided with a projection having a hardness greater than a hardness of each of the first and second bumps. The first and second members are positioned with respect to each other such that the first and second bumps face each other. The tip portion of the first bump is brought into contact with a tip portion of the second bump by sticking the projection into the tip portion of the second bump.

9 Claims, 3 Drawing Sheets

BUMP BONDING METHOD

CROSS REFERENCE TO RELATED APPLICATION

This application is based on and incorporates herein by reference Japanese Patent Application No. 2008-79771 filed on Mar. 26, 2008.

FIELD OF THE INVENTION

The present invention relates to a method of bonding a first bump on a first member and a second bump on a second member so that the first and second member can be joined together.

In a conventional bump bonding method disclosed in JP-A-2007-35918, a first bump on a substrate and a second bump on a semiconductor chip are held in contact at their tips and bonded together by ultrasonic bonding. The area of the tip portion of the first bump is made larger than the area of the tip portion of the second bump so that the first and second bumps can be preciously aligned with each other. Thus, a relative displacement between the first and second bumps can be reduced. In the method, since the area of the tip portion of the first bump is made large, the entire size of the first bump becomes large. Accordingly, the substrate, on which the first bump is formed, needs to be increased in size.

SUMMARY OF THE INVENTION

In view of the above, it is an object of the present invention to provide a method of bonding a first bump on a first member and a second bump on a second member by reducing a relative displacement between the first and second bumps without increasing bump sizes.

According an aspect of the present invention, a method of bonding a first bump on a surface of a first member and a second bump on a surface of a second member includes providing a tip portion of the first bump with a projection. The projection has a hardness greater than a hardness of each of the first and second bumps. The method further includes positioning the first and second members with respect to each other such that the first and second bumps face each other. The method further includes bringing the tip portion of the first bump into contact with a tip portion of the second bump by sticking the projection into the tip portion of the second bump.

According another aspect of the present invention, a method of making a bump bonding structure includes forming a first bump on a surface of a first member, a forming a second bump on a surface of a second member, and forming a rod member having a hardness greater than a hardness of each of the first and second bumps. The rod member has first and second ends. The method further includes sticking the first end of the rod member in a tip portion of the first bump. The method further includes sticking the second end of the rod member in a tip portion of the second bump such that the tip portions of the first and second bumps are in contact with each other. The method can preferably include sharpening at least one of the first and second ends of the rod member.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1A:
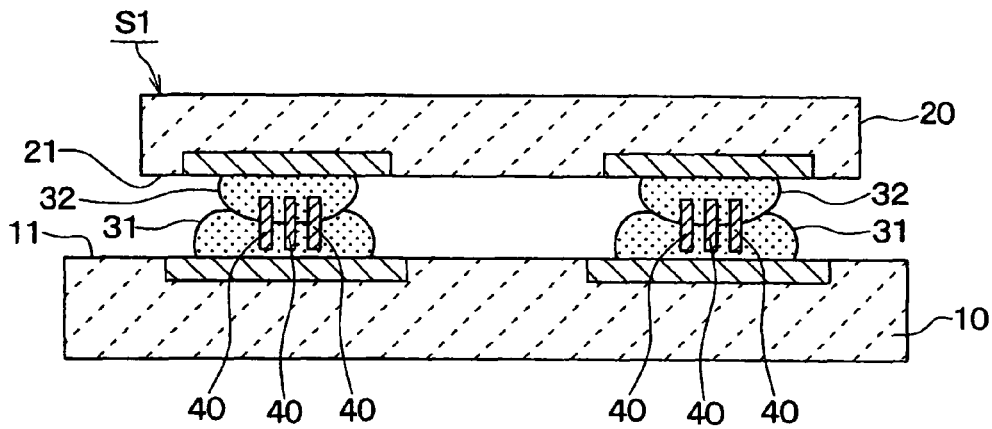
FIG. 1A is a diagram illustrating a cross-sectional view of a bump bonding structure according to a first embodiment of the present invention.
Figure 1B:
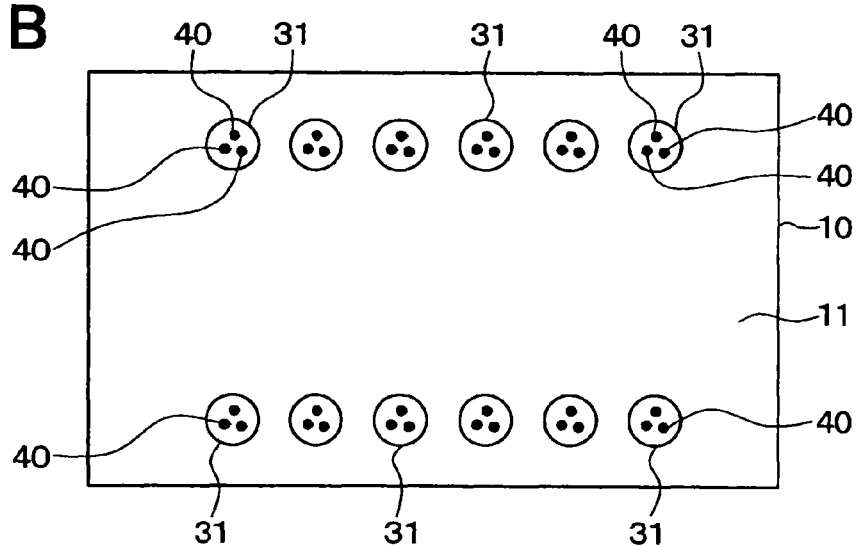
FIG. 1B is a diagram illustrating a plan view of a first semiconductor chip of the bump bonding structure of FIG. 1A.
Figure 1C:
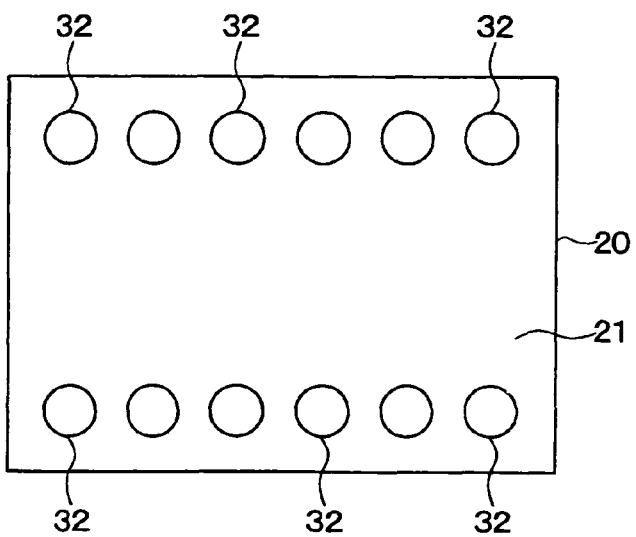
FIG. 1C is a diagram illustrating a plan view of a second semiconductor chip of the bump bonding structure of FIG. 1A.

A bump bonding structure 51 according to a first embodiment of the present invention is described below with reference to FIGS. 1A-1C. FIG. 1A illustrates a cross-sectional view of the bump bonding structure S1. The bump bonding structure S1 includes a first semiconductor chip 10 (as a first member) and a second semiconductor chip 20 (as a second member). FIG. 1B illustrates one surface 11 of the first semiconductor chip 10, and FIG. 1C illustrates one surface 21 of the second semiconductor chip 20.

The semiconductor chips 10, 20 can be made of semiconductor such as silicon by a known semiconductor manufacturing process. Examples of the semiconductor chips 10, 20 can include an integrated circuit (IC) chip, a circuit chip, and a sensor chip for sensing a physical quantity such as pressure, temperature, or the like.

The first semiconductor chip 10 has a first bump 31 on the surface 11. The first bump 31 projects with respect to the surface 11. The second semiconductor chip 20 has a second bump 32 on the surface 21. The second bump 32 projects with respect to the surface 21. In the first embodiment, the first semiconductor chip 10 has six first bumps 31, and the second semiconductor chip 20 has six second bumps 32. The number of the first and second bumps 31, 32 is not be limited to six and can vary. For example, the first semiconductor chip 10 has only one first bump 31, and the second semiconductor chip 20 has only one second bump 32.

Examples of the first and second bumps 31, 32 include plated bumps, stud bumps, or the like. In the first embodiment, the first and second bumps 31, 32 are made of gold (Au). The first and second bumps 31, 32 can be made of a material other than gold. For example, the first and second bumps 31, 32 can be made of solder.

The first and second semiconductor chips 10, 20 are placed such that the surface 11 of the first semiconductor chip 10 faces the surface 21 of the second semiconductor chip 20 and such that the first bump 31 on the surface 11 of the first semiconductor chip 10 is located directly opposite to the second bump 32 on the surface 21 of the second semiconductor chip 20. A tip portion of the first bump 31 is in mechanical (i.e., physical) contact with a tip portion of the second bump 32. In this way, the first and second bumps 31, 32 are joined together so that the first and second semiconductor chips 10, 20 are mechanically (i.e., physically) fixed together and electrically coupled together at the junctions between the first and second bumps 31, 32.

In the first embodiment, as shown in FIGS. 1A and 1B, the tip portion of the first bump 31 of the first semiconductor chip 10 is provided with a projection 40. The projection 40 extends to the second bump 32 of the second semiconductor chip 20. The projection 40 has a hardness greater than a hardness of each of the first and second bumps 31, 32. The projection 40 has a rod-like shape having a length. The projection 40 is thinner in cross section than each of the first and second bumps 31, 32. The projection 40 has an electrical conductivity. Alternatively, the projection 40 can have no electrical conductivity.

For example, the projection 40 can be made of iron, steel, copper, or the like. It is preferable that the projection 40 has a needle-like shape and that both ends of the projection 40 are sharpened. Alternatively, al least of the ends of the projection 40 can be rounded, as long as the projection 40 can be stuck in the first end second bumps 31, 32. For example, the projection 40 can have a circular or rectangular cross section in a direction perpendicular to its length direction.

The length of the projection 40 is less than the sum of heights of the first and second bumps 31, 32 that are joined together. In other words, the length of the projection 40 is less than the distance between the surfaces 11, 21 measured when the first and second semiconductor chip 10, 20 are joined together to form the bump bonding structure S1. In the first embodiment, as shown in FIGS. 1A and 1B, each first bump 31 is provided with three projections 40. The number of the projections 40 provided to the first bump 31 can vary. For example, each first bump 31 can be provided with only one projection 40. Further, the number of the projections 40 provided to the first bump 31 can vary between the first bumps 31. For example, one first bump 31 can be provided with one projection 40, and the other first bump 31 can be provided with two projections 40.

As can be seen from FIG. 1A, the projection 40 provided to the tip portion of the first bump 31 is a separate piece of each of the first and second bumps 31, 32. The projection 40 is stuck in the tip portion of the second bump 32 at the junction between the first and second bumps 31, 32. Thus, in the bump bonding structure S1, the projection 40 is embedded in each of the first and second bumps 31, 32 so that the first and second bumps 31, 32 are coupled together by the projection 40.

Specifically, the projection 40 is stuck and embedded in the first bump 31 at a first end, extends to the second bump 32 across a contact surface between the first and second bumps 31, 32, and is stuck and embedded in the second bump 32 at a second end.

In this way, the projection 40 is stuck and embedded in each of the first bumps 31, 32 so that the first and second bumps 31, 32 are coupled together by the projection 40. The tip portions of the first and second bumps 31, 32 are held in mechanical contact with each other by the projection 40. Thus, the projection 40 prevents a relative displacement between the first and second bumps 31, 32 in a direction parallel to the surfaces 11, 21 of the semiconductor chips 10, 20 (i.e., right-left direction of FIG. 1A).

A method of making the bump bonding structure S1 is described below with reference to FIGS. 2A-2D.

Firstly, the first and second semiconductor chips 10, 20 are prepared. The first and second bumps 31, 32 are preformed on the surfaces 11, 21 of the prepared first and second semiconductor chips 10, 20, respectively.

Then, the projection 40 is provided to the tip portion of the first bump 31 on the surface 11 of the semiconductor chip 10. Specifically, the projection 40 is a separate piece of the first bump 31 and attached to the tip portion of the first bump 31.

Figure 2A:
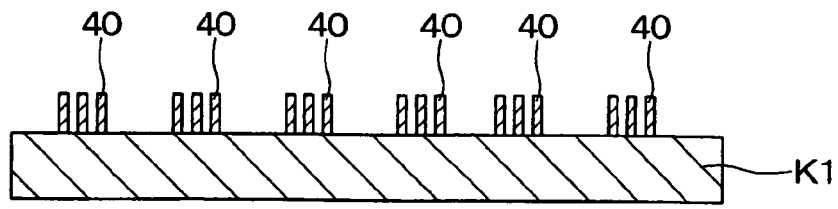
FIGS. 2A-2D are diagrams illustrating a method of making the bump bonding structure of FIG. 1A.

As shown in FIG. 2A, the projection 40 is attached to the tip portion of the first bump 31 using a jig K1. The projection 40 is held in a predetermined location on a surface of the jig K1. Specifically, the second end of the projection 40 to be stuck in the second bump 32 is fixed on the surface of the jig K1, and the first end of the projection 40 to be stuck in the first bump 31 extends upward, perpendicular to the surface of the jig K1. Thus, the projection 40 stands on the surface of the jig K1 such that the length of the projection 40 is substantially perpendicular to the surface of the jig K1.

For example, the projection 40 can be fixed on the surface of the jig K1 by placing an adhesive sheet between the surface of the jig K1 and the projection 40 or by inserting the second end of the projection 40 into a hole provided in the surface of the jig K1. In such an approach, the projection 40 can stand on the surface of the jig K1 with the first end pointing upward.

Figure 2B:
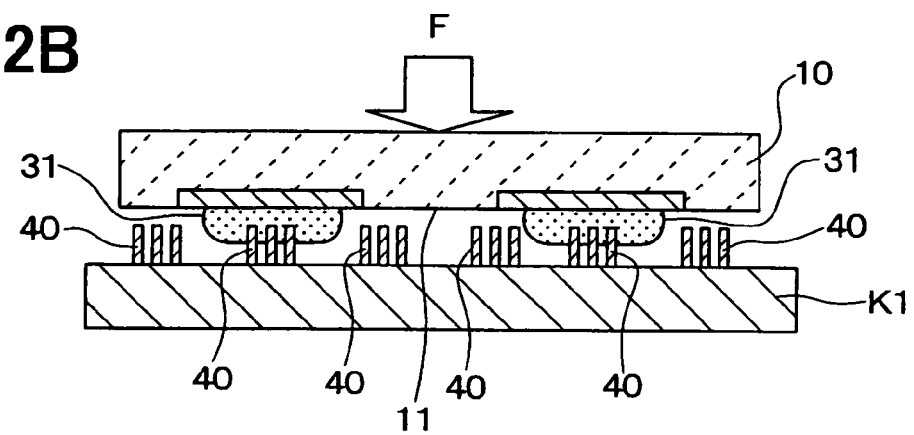

Then, as shown in FIG. 2B, the first semiconductor chip 10 is placed above the jig K1 such that the surface 11 of the first semiconductor chip 10 faces the surface of the jig K1 and such that the first bump 31 faces the projection 40. Then, force F is applied to the semiconductor chip 10 from above so that the first end of the projection 40 is stuck in the tip portion of the first bump 31 on the surface 11 of the first semiconductor chip 10. Thus, the projection 40 is transferred from the jig K1 to the first bump 31 and attached to the tip portion of the first bump 31.

Figure 2C:
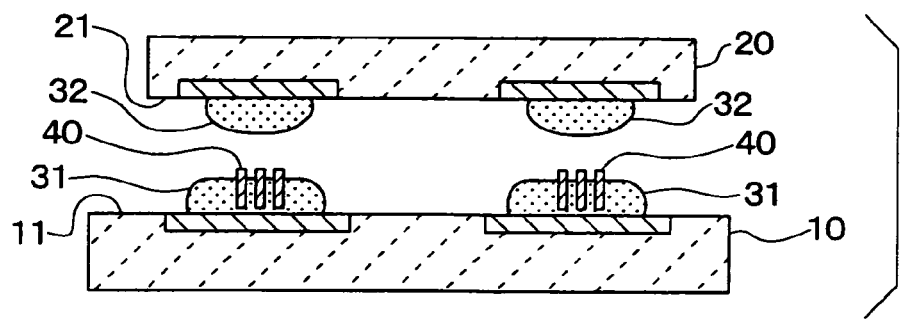
Figure 2D:
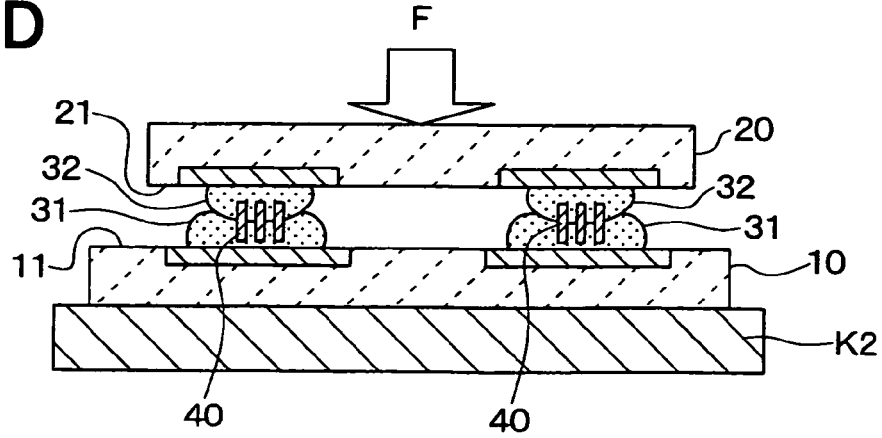

Then, as shown in FIGS. 2C and 2D, the surface 21 of the second semiconductor chip 20 is placed opposite to the surface 11 of the first semiconductor chip 10 on a workbench K2 such that the second bump 32 is aligned with the first bump 31. Then, force F is applied to the second semiconductor chip 20 from above such that the second end of the projection 40 having the first end stuck in the tip portion of the first bump 31 is stuck in the tip portion of the second bump 32. Thus, the tip portion of the first bump 31 is brought into mechanical contact with the tip portion of the second bump 32.

Since the projection 40 is stuck and embedded in each of the first and second bumps 31, 32, the first and second bumps 31, 32 are held in mechanical contact with each other by the projection 40. Thus, the first and second bumps 31, 32 are mechanically joined together and electrically coupled together by the projection 40. In this way, the bump bonding structure S1 shown in FIG. 1A is completed. When the first and second bumps 31, 32 are brought into contact with each other, the first and second bumps 31, 32 can be heated to a temperature lower than a melting point of each of the first and second bumps 31, 32. Alternatively, the first and second bumps 31, 32 can be brought into contact with each other at room temperatures.

By the way, in a conventional bump bonding method disclosed, for example, in JP-A-2007-35918, when the first and second bumps 31, 32 are brought into contact with each other, it is likely that the tip portions of the first and second bumps 31, 32 slide relative to each other due to the application of the force F. As a result, the first and second bumps 31, 32 may be displaced from each other.

In contrast, according to the first embodiment, the first and second bumps 31, 32 are brought into contact with each other by sticking the projection 40 provided to the tip portion of the first bump 31 to the tip portion of the second bump 32. In such an approach, the first an second bumps 31, 32 are fixed together and held in mechanical contact with each other by the projection 40. Thus, the projection prevents the relative displacement between the first and second bumps 31, 32 in the direction parallel to the surfaces 11, 21 of the semiconductor chips 10, 20 at the time when the tip portions of the first and second bumps 31, 32 are brought into contact with each other.

As described above, according to the first embodiment, the first bump 31 is bonded to the second bump 32 by sticking the projection 40 provided to the tip portion of the first bump 31 in the tip portion of the second bump 32. The first and second bumps 31, 32 are held in mechanical contact with each other by the projection 40. Thus, the projection 40 prevents the relative displacement between the first and second bumps 31, 32. Therefore, there is no need to increase sizes of the first and second bumps 31, 32 to prevent the relative displacement between the first and second bumps 31, 32. Further, the first and second bumps 31, 32 can be bonded together without ultrasonic bonding.

Further, according to the first embodiment, the projection 40 has a hardness greater than a hardness of each of the first and second bumps, 31, 32. Therefore, the projection 40 can be easily stuck in the first and second bumps 31, 32. The projection 40 can have an electrical conductivity. Therefore, even when the tips of the first and second bumps 31, 32 are in poor contact with each other, the first and second bumps 31, 32 can be electrically coupled together though the projection 40.

Furthermore, according to the first embodiment, the projection 40 is attached to the tip portion of the first bump 31 by transferring the projection 40 from the jig K1 to the tip portion of the first bump 31. Therefore, even when the first bumps 31 are large in number, the projections 40 can be collectively attached to the respective first bumps 31. Since the projection 40 has a shape like a thin rod, the projection 40 is easily stuck in the first and second bumps 31, 32 so that the projection 40 can be easily transferred to the first bump 31 from the jig K1. The projection 40 can be more easily stuck in the first and second bumps 31, 32 by sharpening the ends of the projection 40.

Second Embodiment

Figure 3:
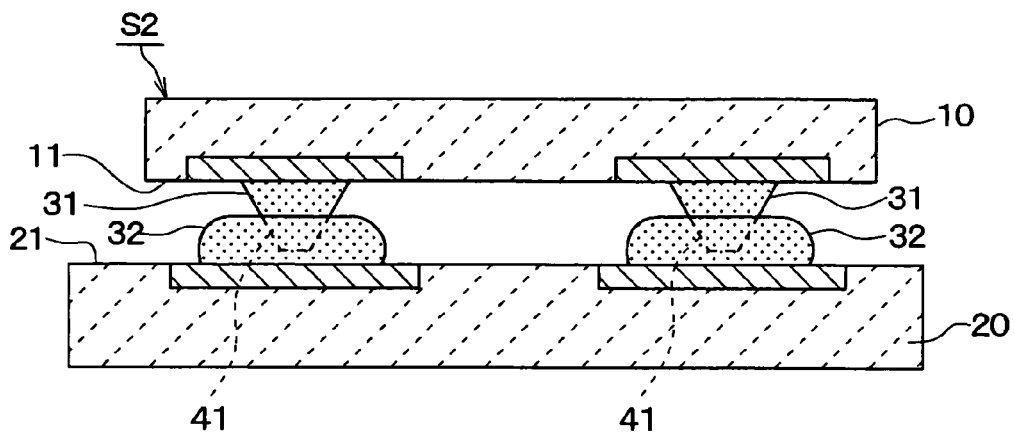
FIG. 3 is a diagram illustrating a cross-sectional view of a bump bonding structure according to a second embodiment of the present invention.

A bump bonding structure S2 according to a second embodiment of the present invention is described below with reference to FIG. 3. A difference between the first and second embodiments is as follows.

In the bump bonding structure S2, the first semiconductor chip 10 is located above the second semiconductor chip 20. The tip portion of the first bump 31 on the surface 11 of the first semiconductor chip 10 is provided with a projection 41. The projection 41 extends to the second bump 32 on the surface 21 of the second semiconductor chip 20. The projection 41 is stuck and embedded in the tip portion of the second bump 32 at the junction between the first and second bumps 31, 32.

Since the projection 41 provided to the first bump 31 is stuck and embedded in the second bump 32, the first and second bumps 31, 32 are held in mechanical contact with each other by the projection 41. Thus, the projection 41 prevents the relative displacement between the first and second bumps 31, 32 at the time when the tip portions of the first and second bumps 31, 32 are brought into contact with each other. Therefore, there is no need to increase the sizes of the first and second bumps 31, 32 to prevent the relative displacement between the first and second bumps 31, 32.

In the first embodiment, the projection 40 and the first bump 31 are formed as separate pieces. In contrast, in the second embodiment, the projection 41 and the first bump 31 are integrally formed with each other as a single piece.

Further, in the second embodiment, the first bump 31 has a hardness greater than a hardness of the second bump 32. For example, when each of the first and second bumps 31, 32 is made of gold, the hardness of the first bump 31 can be greater than the hardness of the second bump 32 by changing the purity of gold in the first and second bumps 31, 32. Specifically, when the first bump 31 is made of gold alloy with 1% palladium (Pd), and the second bump 32 is made of gold having the purity of 4N, the hardness of the first bump 31 can be greater than the hardness of the second bump 32.

The tip portion of the first bump 31 is sharpened so that the sharpened tip portion serves as the projection 41. In contrast, the tip portion of the second bump 31 is flattened. The sharpened tip portion (i.e., projection 41) of the first bump 31 is stuck and embedded in the flattened tip portion of the second bump 32 at the junction between the first and second bumps 31, 32. For example, the first bump 31 can have a conical shape, a pyramidal shape, or the like. The first bump 31 can be formed, for example, by using a mold having a cavity corresponding to the shape of the first bump 31. The tip portion of the second bump 31 can be flattened, for example, by applying force to the tip portion of the second bump 31 through a plate made of glass, silicon, or the like.

Figure 4A:
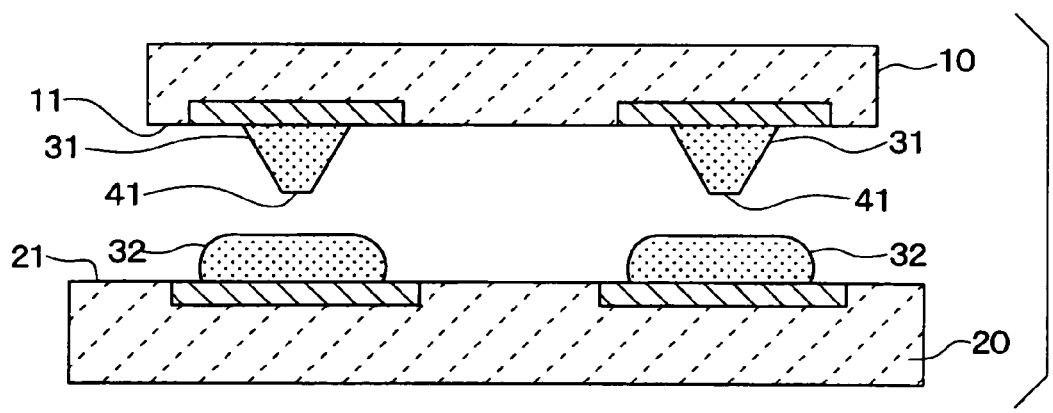
FIGS. 4A and 4B are diagrams illustrating a method of making the bump bonding structure of FIG. 3.
Figure 4B:
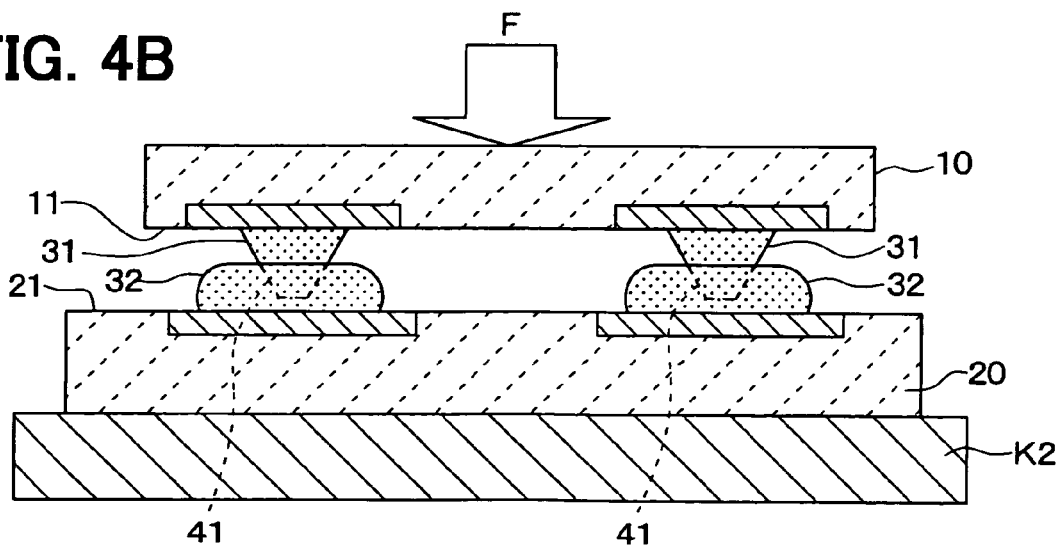

A method of making the bump bonding structure S2 is described below with reference to FIGS. 4A and 4B.

Firstly, the first bump 31 having the sharpened tip portion as the projection 41 is formed on the surface 11 of the semiconductor chip 10, and the second bump 32 having the flattened tip portion is formed on the surface 21 of the second semiconductor chip 20. Then, as shown in FIG. 4A, the surface 11 of the first semiconductor chip 10 is placed opposite to the surface 21 of the second semiconductor chip 20 such that the first bump 31 is aligned with the second bump 32. Then, as shown in FIG. 4B, on a workbench K2, force F is applied to the first semiconductor chip 10 from above such that the sharpened tip portion (i.e., projection 41) of the first bump 31 is stuck in the flattened tip portion of the second bump 32. Thus, the tip portion of the first bump 31 is brought into mechanical contact with the tip portion of the second bump 32.

Since the projection 41 of the first bump 31 is stuck and embedded in the second bump 32, the first and second bumps 31, 32 are held in mechanical contact with each other by the projection 41. Thus, the first and second bumps 31, 32 are mechanically joined together and electrically coupled together by the projection 41. In this way, the bump bonding structure S2 shown in FIG. 3 is completed. When the first and second bumps 31, 32 are brought into contact with each other, the first and second bumps 31, 32 can be heated to a temperature lower than a melting point of each of the first and second bumps 31, 32. Alternatively, the first and second bumps 31, 32 can be brought into contact with each other at room temperatures.

(Modifications)

The embodiments described above can be modified in various ways. For example, in the first embodiment, the projection 40 is transferred to the first bump 31 from the jig K1 by sticking the projection 40 in the first bump 31. Alternatively, the projection 40 can be transferred to the first bump 31 from the jig K1 by pressing the projection 40 on the first bump 31. The projections 40, 41 can be made of the first and second bumps 31, 32. In such a case, it is preferable than the ends of the projections 40, 41 are sharpened so that the projections 40, 41 can be stuck in and embedded in the first end second bumps 31, 32. The projection 40 can be made of an electrically insulating material such as ceramic. The projections 40, 41 can be provided to the second bump 32 instead of the first bump 31. The first and second bumps 31, 32 can be formed to a member other than a semiconductor chip. For example, the first and second bumps 31, 32 can be formed to an electronic device (e.g., resister), a flip chip device, a wiring board, a lead frame, a busbur, or the like. For example, the first bump 31 can be formed to a semiconductor chip, and the second bump 32 can be formed to the wiring board.

Such changes and modifications are to be understood as being within the scope of the present invention as defined by the appended claims.

What is claimed is:

1. A method of bonding a first bump on a surface of a first member and a second bump on a surface of a second member, the method comprising:
    providing a tip portion of the first bump with a projection, the projection having a hardness greater than a hardness of each of the first and second bumps;
    positioning the first and second members with respect to each other such that the first and second bumps face each other; and
    bringing the tip portion of the first bump into contact with a tip portion of the second bump by sticking the projection into the tip portion of the second bump until the projection is fully buried in the second bump without melting the first and second bumps.

2. The method according to claim 1, wherein
    each of the first and second hump is made of gold, and
    the projection is made of steel or copper.

3. The method according to claim 1, wherein
    the providing includes preparing the projection as a separate piece of the first bump and attaching the projection to the tip portion of the first bump.

4. The method according to claim 3, wherein
    the providing further includes holding the projection in a predetermined location on a surface of a jig and placing the first member above the jig such that the tip portion of the first bump face the projection, and
    the attaching includes transferring the projection from the jig to the tip portion of the first bump.

5. The method according to claim 4, wherein
    the projection has a shape like a rod having a length,
    the holding includes standing the projection on the surface of the jig such that the length of the projection is substantially perpendicular to the surface of the jig, and
    the transferring includes applying force to the first member to move the first member toward the jig until the projection is stuck in the tip portion of the first bump.

6. The method according to claim 1, further comprising flattening the tip portion of the second bump, wherein
    the providing includes sharpening the tip portion of the first bump such that the sharpened tip portion serves as the projection, and
    the bringing includes sticking the sharpened tip portion of the first bump in the flattened tip portion of the second bump.

7. The method according to claim 1, wherein
    the projection is made of an electrically insulating material.

8. A method of making a bump bonding structure comprising:
    forming a first bump on a surface of a first member;
    forming a second bump on a surface of a second member;
    preparing a rod member having a hardness greater than a hardness of each of the first and second bumps, the rod member having first and second ends;
    sticking the first end of the rod member in a tip portion of the first bump; and
    sticking the second end of the rod member in a tip portion of the second bump by fully burying the second end of the rod member in the second bump without melting the first and second bumps such that the tip portions of the first and second bumps are in contact with each other.

9. The method according to claim 8, wherein
    the preparing includes sharpening at least one of the first and second ends of the rod member.

* * * * *